(12) United States Patent
Matsushima et al.

(10) Patent No.: US 11,367,942 B2
(45) Date of Patent: Jun. 21, 2022

(54) ANTENNA DEVICE AND IC CARD HAVING THE SAME

(71) Applicant: TDK Corporation, Tokyo (JP)

(72) Inventors: Masaki Matsushima, Tokyo (JP); Noritaka Chiyo, Tokyo (JP); Tomohiro Moriki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 239 days.

(21) Appl. No.: 16/862,794

(22) Filed: Apr. 30, 2020

(65) Prior Publication Data

US 2020/0381802 A1  Dec. 3, 2020

(30) Foreign Application Priority Data

May 28, 2019 (JP) .............................. JP2019-099246

(51) Int. Cl.
| | |
|---|---|
| *H01Q 1/22* | (2006.01) |
| *H01Q 7/00* | (2006.01) |
| *H01Q 1/50* | (2006.01) |
| *H01F 27/245* | (2006.01) |
| *H01F 27/28* | (2006.01) |
| *H01L 23/66* | (2006.01) |
| *H03H 7/38* | (2006.01) |

(52) U.S. Cl.
CPC ......... *H01Q 1/2283* (2013.01); *H01F 27/245* (2013.01); *H01F 27/2804* (2013.01); *H01L 23/66* (2013.01); *H01Q 1/50* (2013.01); *H01Q 7/00* (2013.01); *H03H 7/38* (2013.01); *H01L 2223/6677* (2013.01)

(58) Field of Classification Search
CPC .......... H01Q 1/2283; H01Q 1/50; H01Q 7/00; H01Q 1/2216; H01Q 1/36; H01Q 1/38; H01Q 23/00; H01F 27/245; H01F 27/2804; H01F 2038/143; H01F 38/14; H01L 23/66; H01L 2223/6677; H03H 7/38; G06K 19/07794; H04B 5/0093
See application file for complete search history.

(56) References Cited

U.S. PATENT DOCUMENTS

| | | | | |
|---|---|---|---|---|
| 8,517,280 | B2* | 8/2013 | Owada ..................... | H01Q 7/00 235/494 |
| 9,195,932 | B2* | 11/2015 | Finn ................. | G06K 19/07769 |
| 10,275,703 | B2* | 4/2019 | Herslow ................ | G06K 19/02 |

FOREIGN PATENT DOCUMENTS

| | | |
|---|---|---|
| JP | 11-149536 A | 6/1999 |
| JP | 2008-067057 A | 3/2008 |

* cited by examiner

*Primary Examiner* — Seung H Lee
(74) *Attorney, Agent, or Firm* — McDermott Will & Emery LLP

(57) ABSTRACT

Disclosed herein is an antenna device that includes a substrate; a conductor pattern formed on the substrate and including a spiral or loop-shaped antenna coil, a spiral or loop-shaped coupling coil being connected to the antenna coil and having a diameter smaller than that of the antenna coil, and a spiral-shaped booster coil at least partially overlapping the antenna coil through the substrate without being connected thereto; and a resonance capacitor connected to the booster coil. The number of turns of the booster coil is larger than that of the antenna coil.

16 Claims, 9 Drawing Sheets

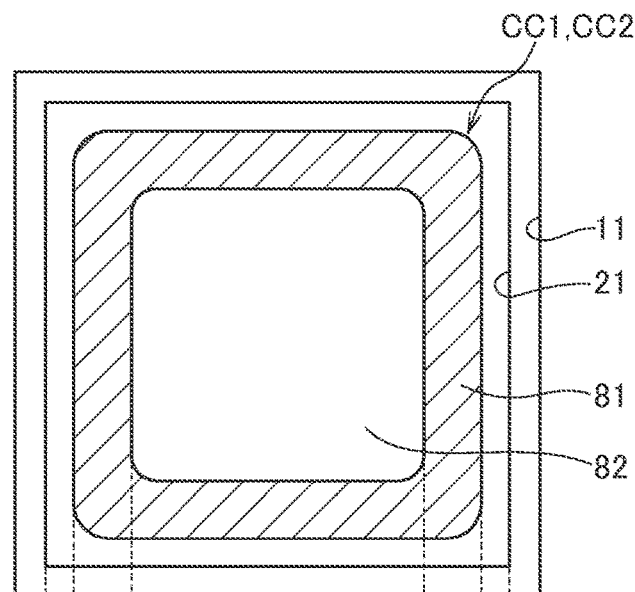
FIG.8A
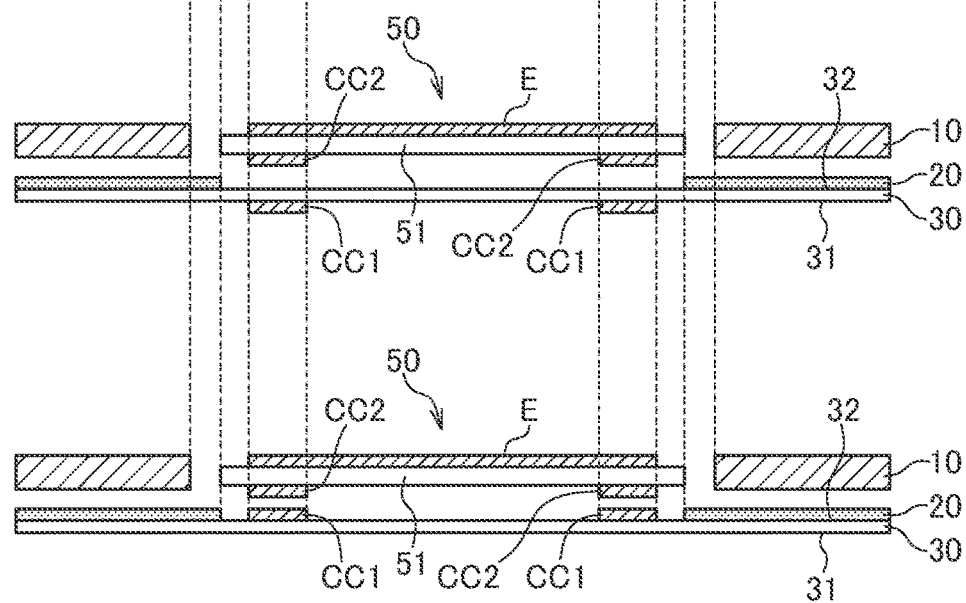
FIG.8B
FIG.8C

ANTENNA DEVICE AND IC CARD HAVING THE SAME

BACKGROUND OF THE INVENTION

Field of the Invention

The present invention relates to an antenna device and an IC card having the antenna device and, more particularly, to an antenna device including a coupling coil electromagnetically coupled to an IC module and an antenna coil electromagnetically coupled to a card reader and an IC card provided with the antenna device having such a configuration.

Description of Related Art

IC cards having an IC module have been widely used recently. For example, JP H11-149536A and JP 2008-067057A disclose an IC card including a coupling coil electromagnetically coupled to an IC module and an antenna coil electromagnetically coupled to a card reader. Having such a coupling coil electromagnetically coupled to the IC module, the IC cards described in JP H11-149536A and JP 2008-067057A can feed electrical power and transmit/receive signals with respect to the IC module without directly connecting the antenna coil and the IC module.

In order to extend communication distance between the IC card and the card reader, the number of turns of the antenna coil may be increased.

However, in an IC card having a coupling coil in addition to the antenna coil, there exist both a resistance component of the antenna coil and a resistance component of the coupling coil, so that an increase in the number of turns of the antenna coil leads to a further increase in the resistance component. Thus, in the IC card having the antenna coil and coupling coil, it is not easy to extend communication distance while suppressing the resistance components of the antenna coil and coupling coil.

SUMMARY

It is therefore an object of the present invention to provide an antenna device including an antenna coil and a coupling coil and an IC card having such an antenna device, in which communication distance is extended while the resistance components of the antenna coil and coupling coil are suppressed.

An antenna device according to the present invention includes: a substrate; a conductor pattern formed on the surface of the substrate and including a spiral or loop-shaped antenna coil, a spiral or loop-shaped coupling coil being connected to the antenna coil and having a diameter smaller than that of the antenna coil, and a spiral-shaped booster coil at least partially overlapping the antenna coil through the substrate without being connected thereto; and a resonance capacitor connected to the booster coil, wherein the number of turns of the booster coil is larger than that of the antenna coil.

According to the present invention, there is provided the booster coil that is electromagnetically coupled to the antenna coil without being connected thereto, so that it is possible to extend communication distance without increasing the number of turns of the antenna coil. In addition, the number of turns of the booster coil is larger than that of the antenna coil, so that it is possible to ensure a sufficient communication distance.

In the present invention, the substrate may have a rectangular shape, the antenna coil may be formed on one surface of the substrate along the sides thereof, and the booster coil may be formed on the other surface of the substrate along the sides thereof. With this configuration, the antenna coil and booster coil can each have a sufficiently large inner diameter area.

In the present invention, the coupling coil may be provided at a position overlapping the inner diameter areas of the respective antenna coil and booster coil and disposed offset to one short side of the substrate. With this configuration, an IC module can be disposed at a position overlapping the inner diameter areas of the respective antenna coil and booster coil and offset to the one short side of the substrate.

In the present invention, the resonance capacitor may be constituted by the conductor pattern and disposed offset to the other short side of the substrate. This can prevent mutual interference between the coupling coil and the resonance capacitor.

In the present invention, the conductor pattern may further include a matching capacitor connected in series or parallel to the antenna coil, and the matching capacitor may be provided at a position overlapping the inner diameter areas of the respective antenna coil and booster coil and disposed offset to the one short side of the substrate. With this configuration, the matching capacitor can be disposed in the vicinity of the coupling coil.

An IC card according to the present invention includes the above-described antenna device, a metal plate provided overlapping the antenna device, a magnetic sheet disposed between the antenna device and the metal plate, and an IC module electromagnetically coupled to a coupling coil.

According to the present invention, the IC card can perform communication with the card reader without being blocked by the metal plate.

In the present invention, the metal plate may have a first opening, the IC module may be disposed within the first opening, the magnetic sheet may have a second opening at a portion overlapping the IC module, and the coupling coil and IC module may be electromagnetically coupled to each other through the second opening. With this configuration, the coupling coil and IC module can be electromagnetically coupled to each other without being blocked by the magnetic sheet.

In the present invention, the inner diameter area of the coupling coil may completely overlap the second opening in a plan view, and the coil area of the coupling coil may completely overlap the second opening in a plan view. With this configuration, it is possible to sufficiently enhance the coupling strength between the coupling coil and the IC module.

In the present invention, the coupling coil may be formed on a surface of the substrate that is opposite to the surface facing the magnetic sheet. With this configuration, the coupling coil is not damaged in a process of forming the second opening in the magnetic sheet.

As described above, according to the present invention, in an antenna device including an antenna coil and a coupling coil and in an IC card having the antenna device, it is possible to extend communication distance while suppressing the resistance components of the antenna coil and coupling coil.

BRIEF DESCRIPTION OF THE DRAWINGS

The above features and advantages of the present invention will be more apparent from the following description of certain preferred embodiments taken in conjunction with the accompanying drawings, in which:

FIGS. 8A to 8C are views illustrating a preferred relationship between the coupling coils and openings, where FIG. 8A is a plan view, FIG. 8B is a cross-sectional view, and FIG. 8C is a cross sectional view according to a modification.

DETAILED DESCRIPTION OF THE EMBODIMENTS

Preferred embodiments of the present invention will be explained below in detail with reference to the accompanying drawings.

Figure 1:
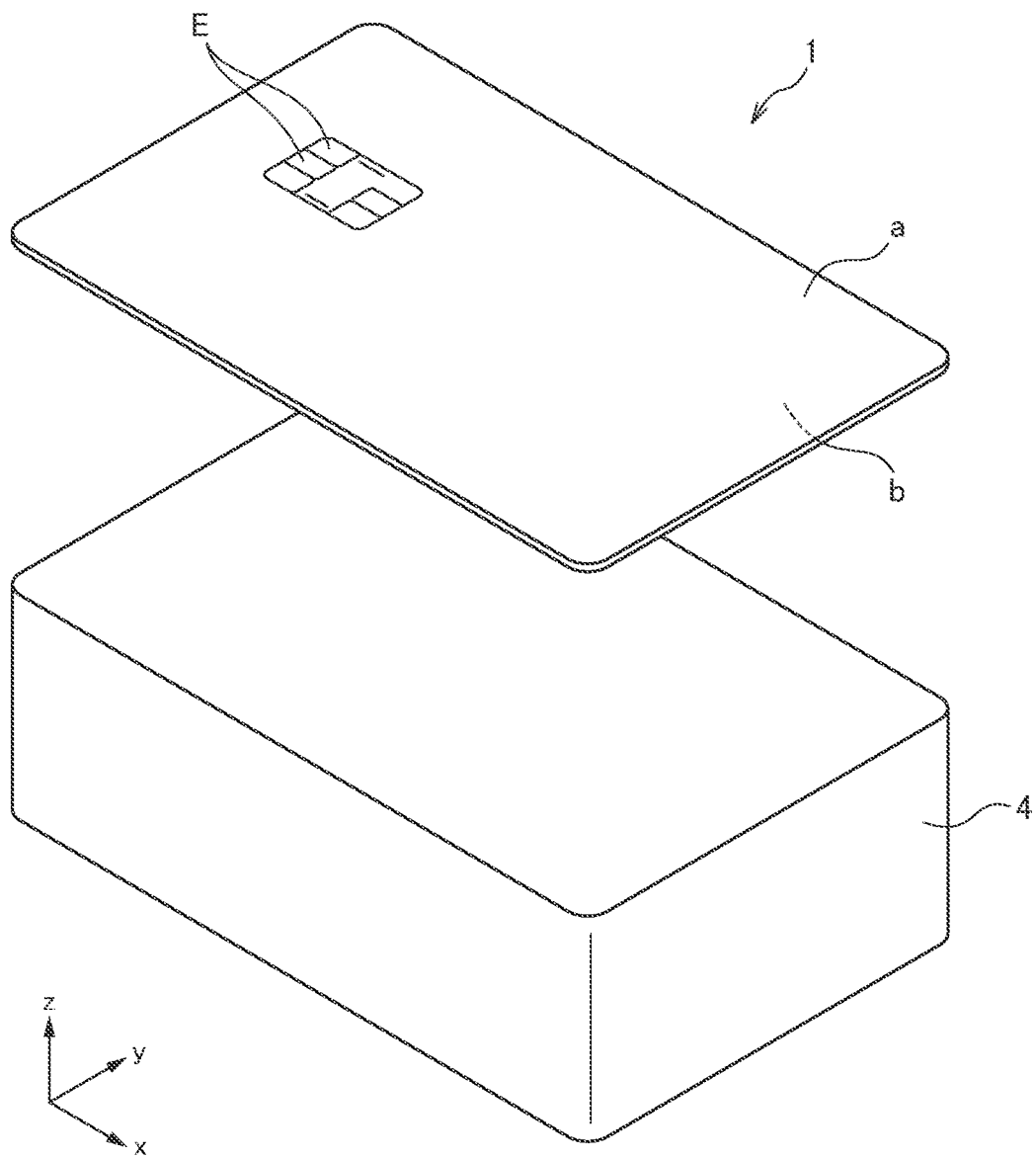
FIG. 1 is a schematic perspective view illustrating the outer appearance of an IC card according to a preferred embodiment of the present invention.

FIG. 1 is a schematic perspective view illustrating the outer appearance of an IC card 1 according to a preferred embodiment of the present invention.

As illustrated in FIG. 1, an IC card 1 according to the present embodiment is a plate-like member having the x-direction as the longitudinal direction, y-direction as the lateral direction, and Z-direction as the thickness direction and has an upper surface a and a back surface b each of which constitutes the xy plane. The IC card incorporates therein an IC module to be described later, and a terminal electrode E of the IC module is exposed to the upper surface a of the IC card 1. The IC card 1 can perform communication with a card reader 4 in a state where the back surface b faces the card reader 4.

Figure 2:
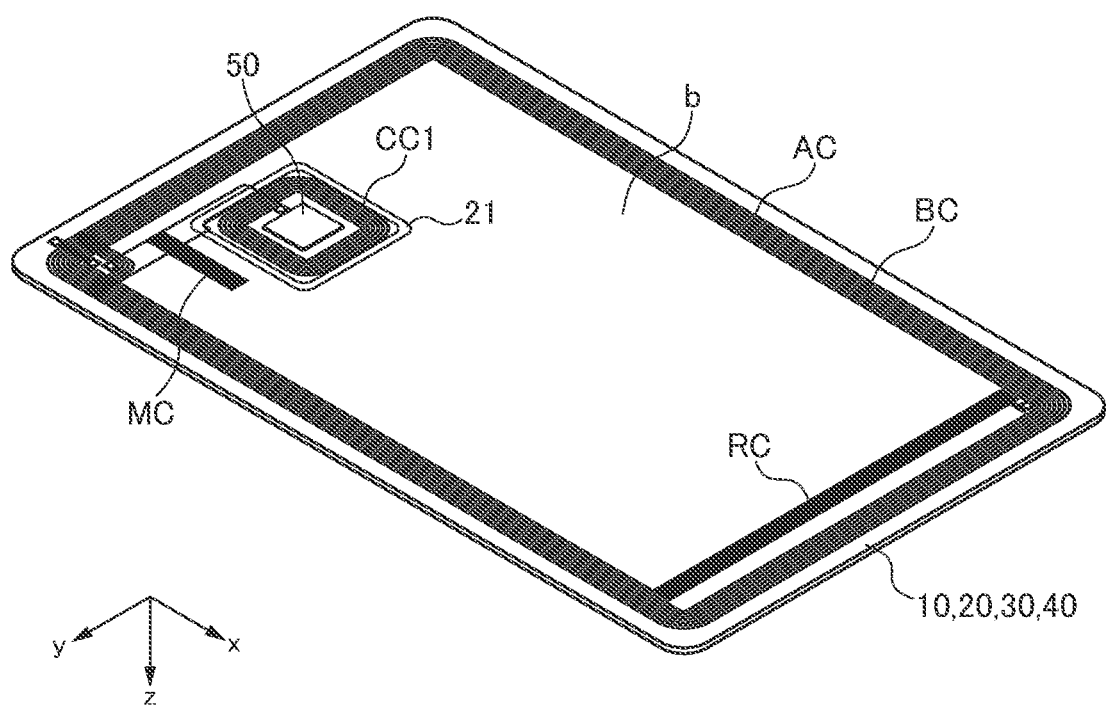
FIG. 2 is a schematic transparent perspective view of the IC card shown in FIG. 1 as viewed from the back surface side.
Figure 3:
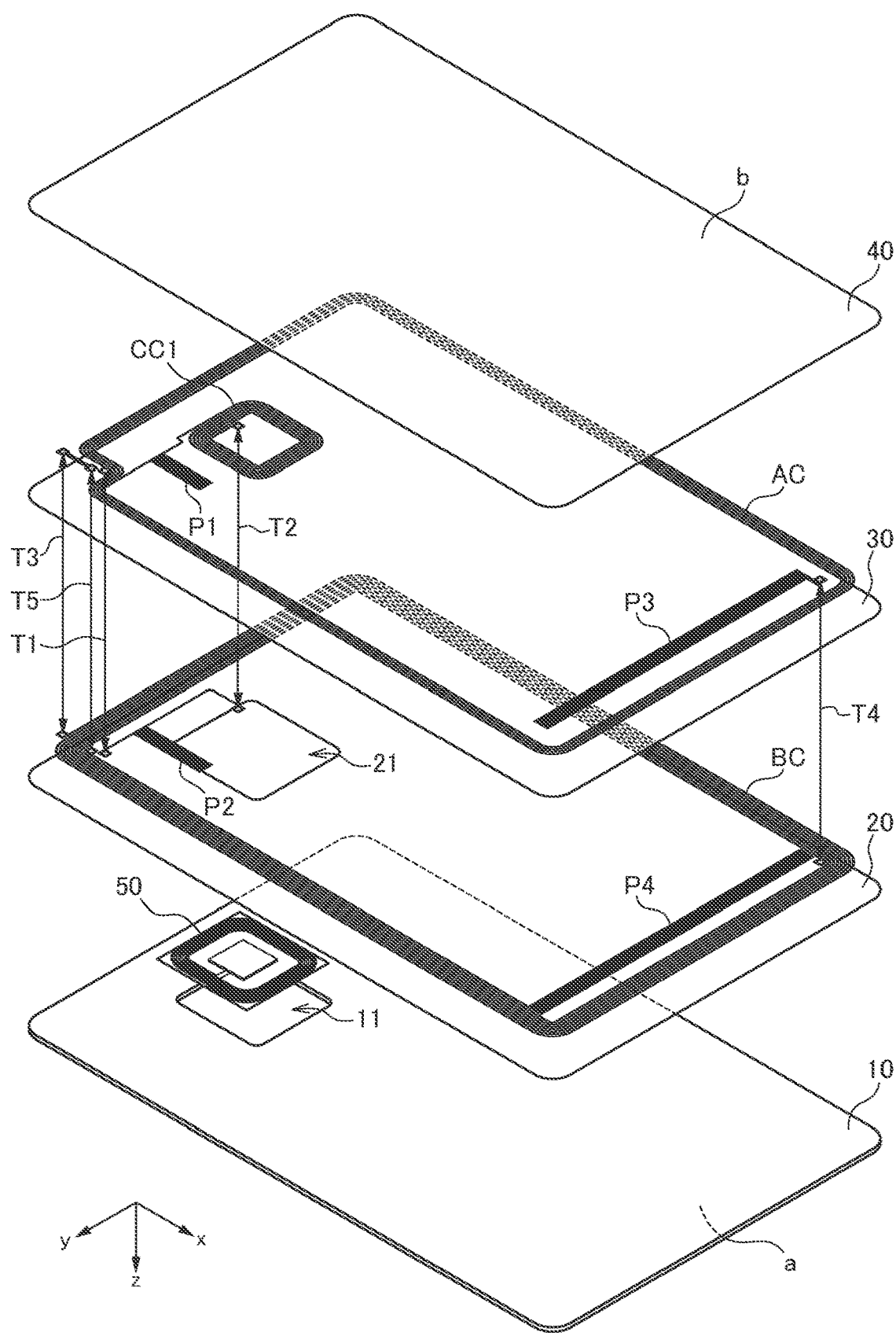
FIG. 3 is a schematic exploded perspective view of the IC card shown in FIG. 1.

FIG. 2 is a schematic transparent perspective view of the IC card 1 as viewed from the back surface b side, and FIG. 3 is a schematic exploded perspective view of the IC card 1.

As illustrated in FIGS. 2 and 3, the IC card 1 according to the present embodiment has a structure in which a metal plate 10, a magnetic sheet 20, a substrate 30, and a cover layer 40 are laminated in this order from the upper surface a side toward the back surface b side. The metal plate 10 is made of a metal material such as stainless or titanium, and one surface thereof serves as the upper surface a of the IC card 1. The metal plate 10 has an opening 11, in which an IC module 50 is disposed.

The substrate 30 is a film made of an insulating resin material such as PET and has a conductive pattern on both surfaces thereof to constitute an antenna device. The thickness of the substrate 30 can be, but is not particularly limited to, 20 μm to 30 μm.

Figure 4:
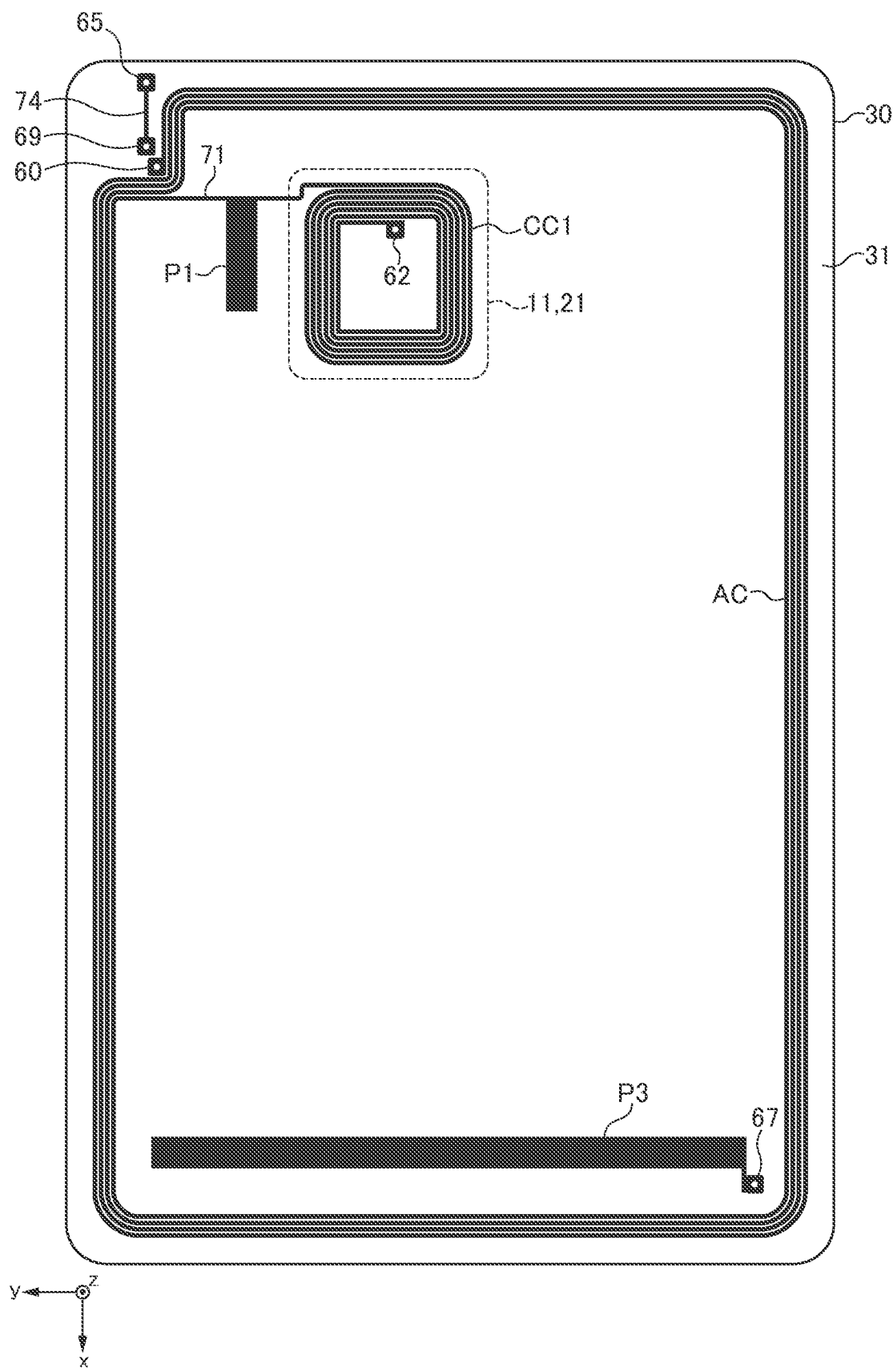
FIG. 4 is a schematic plan view illustrating a conductor pattern formed on one surface of the substrate.
Figure 5:
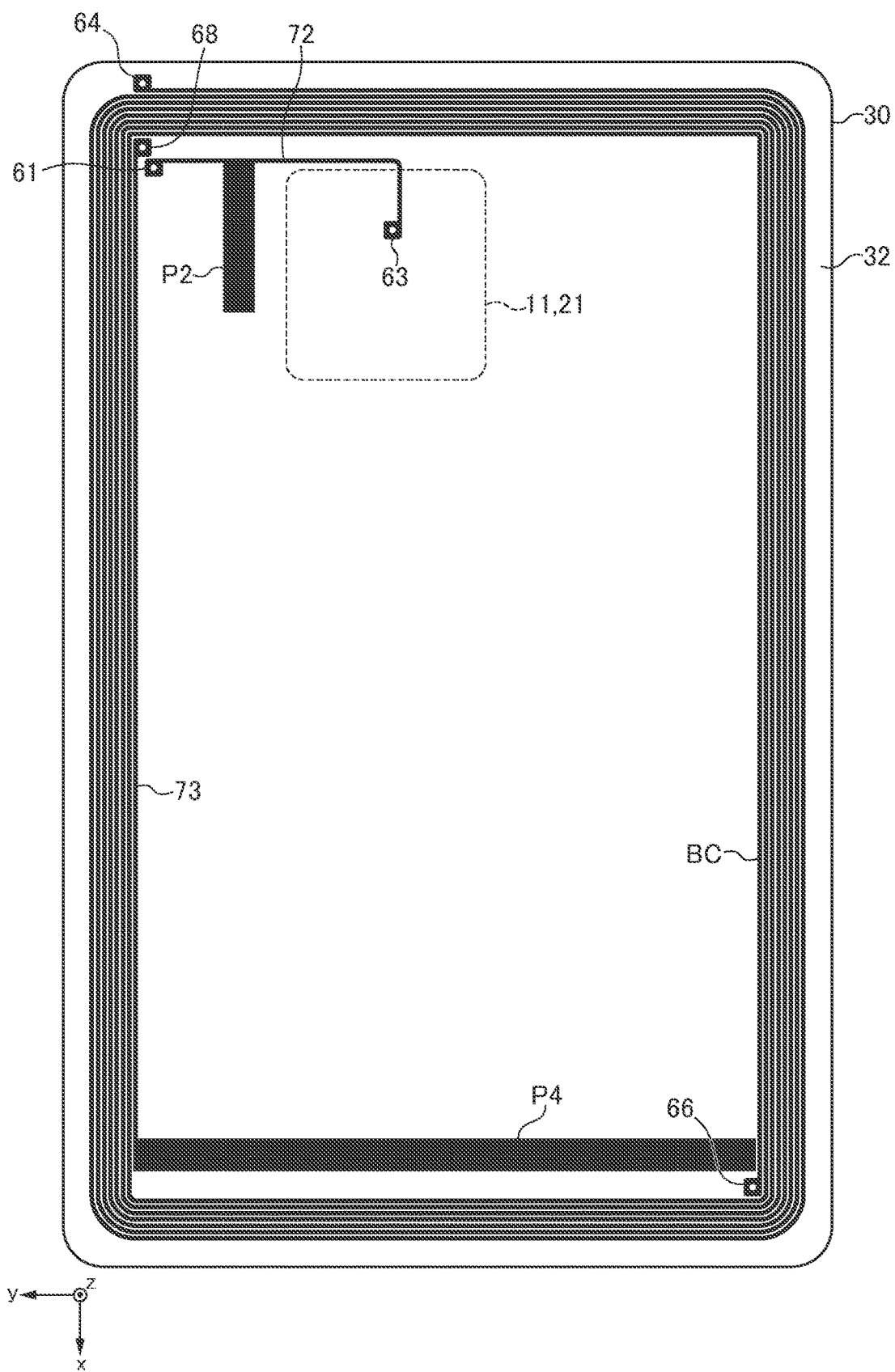
FIG. 5 is a schematic transparent plan view of a conductor pattern formed on the other surface of the substrate as viewed from the one surface side.
Figure 6:
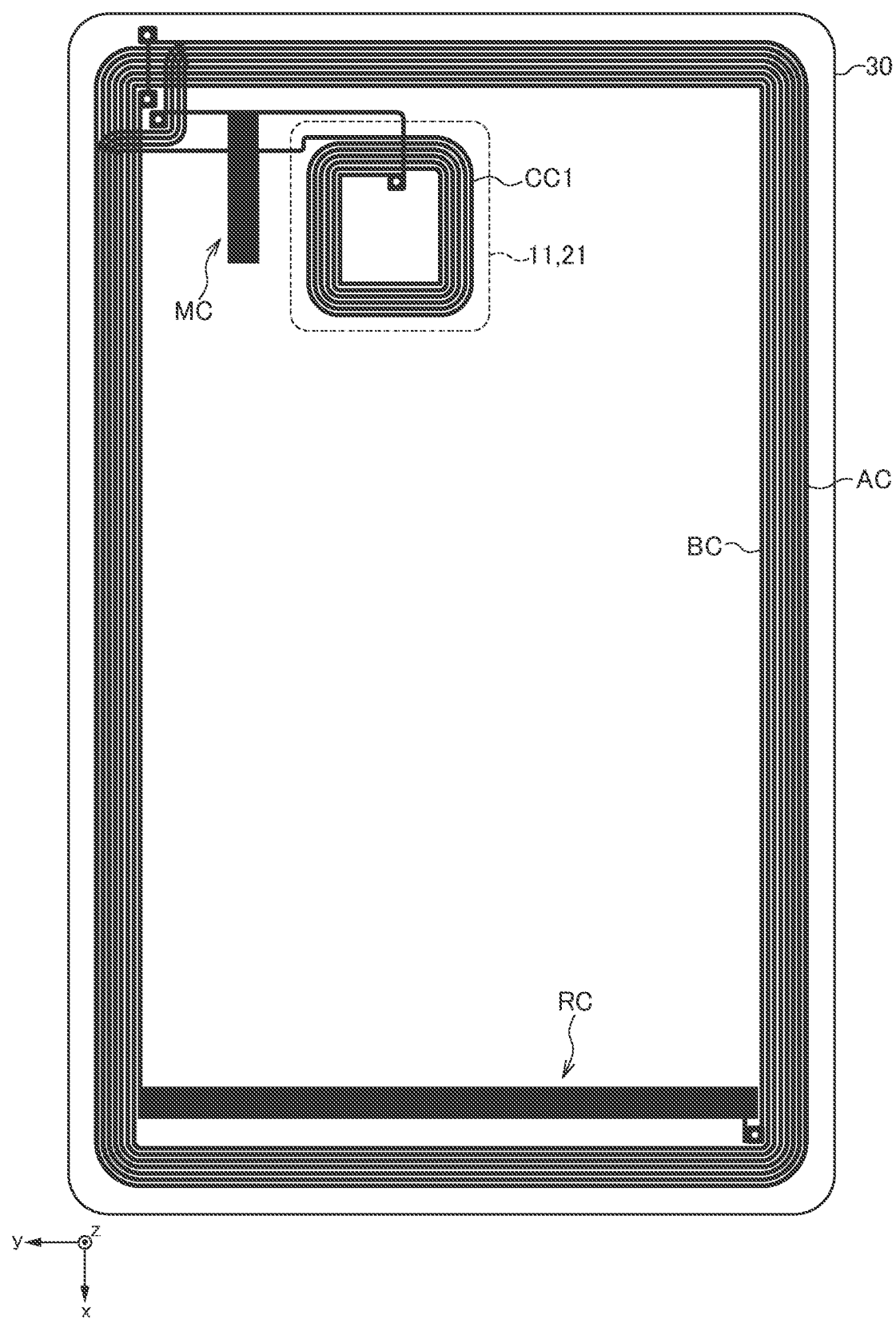
FIG. 6 is a schematic transparent plan view illustrating the conductor pattern formed on the one surface and the conductor pattern formed on the other surface in an overlapping manner.

FIG. 4 is a schematic plan view illustrating a conductor pattern formed on one surface 31 of the substrate 30. FIG. 5 is a schematic transparent plan view of a conductor pattern formed on the other surface 32 of the substrate 30 as viewed from the one surface 31 side. FIG. 6 is a schematic transparent plan view illustrating the conductor pattern formed on the one surface 31 and the conductor pattern formed on the other surface 32 in an overlapping manner.

As illustrated in FIG. 4, the conductor pattern formed on the one surface 31 of the substrate 30 includes an antenna coil AC, a coupling coil CC1, capacitor electrode patterns P1, P3, and connection patterns 71 and 74. The antenna coil AC is a loop antenna spirally wound by, e.g., four turns along the four sides of the substrate 30 having a rectangular shape. Since the antenna coil AC is disposed along the four sides of the substrate 30, a large part of the one surface 31 of the substrate 30 serves as the inner diameter area of the antenna coil AC. Note that the antenna coil AC may not necessarily be wound by a plurality of turns and may be a loop of one turn. On the other hand, the coupling coil CC1 is a coil having a smaller diameter which is disposed in the inner diameter area of the antenna coil AC and is spirally wound by, e.g., five turns. The coupling coil CC1 also may not necessarily be wound by a plurality of turns and may be a loop of one turn.

The inner peripheral end of the antenna coil AC and the outer peripheral end of the coupling coil CC1 are short-circuited through the connection pattern 71. The connection pattern 71 is connected with the capacitor electrode pattern P1. An outer peripheral end 60 of the antenna coil AC is connected, through a through hole conductor T1 penetrating the substrate 30, to a connection node 61 provided on the other surface 32 of the substrate 30. An inner peripheral end 62 of the coupling coil CC1 is connected, through a through hole conductor T2 penetrating the substrate 30, to a connection node 63 provided on the other surface 32 of the substrate 30. As illustrated in FIG. 5, the connection node 61 and the connection node 63 are short-circuited through the connection pattern 72. The connection pattern 72 is connected to the capacitor electrode pattern P2 provided at a position overlapping the capacitor electrode pattern P1 in a plan view.

With the above configuration, the antenna coil AC and the coupling coil CC1 are connected in series, and a matching capacitor MC constituted by the capacitor electrode patterns P1 and P2 is inserted into the connecting portion therebetween. Thus, the antenna coil AC and the coupling coil CC1 do not each have an external terminal for direct current connection and are each a completely closed circuit in terms of direct current.

As illustrated in FIG. 5, the conductor pattern formed on the other surface 32 of the substrate 30 includes a booster coil BC, capacitor electrode patterns P2, P4, and connection patterns 72 and 73. The booster coil BC is spirally wound by, e.g., eight turns along the four sides of the rectangular substrate 30. Since the booster coil BC is disposed along the four sides of the substrate 30, a large part of the other surface 32 of the substrate 30 serves as the inner diameter area of the booster coil BC. Since the booster coil BC and the antenna coil AC overlap each other, they are electromagnetically coupled to each other.

An outer peripheral end 64 of the booster coil BC is connected, through a through hole conductor T3 penetrating the substrate 30, to a connection node 65 provided on the one surface 31 of the substrate 30. An inner peripheral end 66 of the booster coil BC is connected, through a through hole conductor T4 penetrating the substrate 30, to a connection node 67 provided on the one surface 31 of the substrate 30. The connection node 67 is connected to the capacitor electrode pattern P3. The capacitor electrode pattern P4 is provided on the other surface 32 of the substrate 30 at a position overlapping the capacitor electrode pattern P3, and a resonance capacitor RC is constituted by the capacitor electrode patterns P3 and P4. The capacitor electrode pattern P4 is connected to the connection node 68 through the connection pattern 73. The connection node 68 is connected, through a through hole conductor T5 penetrating the substrate 30, to a connection node 69 provided on the one surface 31 of the substrate 30. The connection nodes 65 and 69 are short-circuited through the connection pattern 74.

With the above configuration, the booster coil BC and the resonance capacitor RC are connected in series. Thus, the booster coil BC does not each have an external terminal for direct current connection and is a completely closed circuit in terms of direct current.

The coupling coil CC1 is disposed at a position overlapping the opening 11 of the metal plate 10 so as to overlap the IC module 50. The opening 11 of the metal plate 10 is formed at a position offset in the negative x-direction of the substrate 30, i.e., to one short side of the substrate and, accordingly, the coupling coil CC1 is likewise disposed offset. Similarly, the matching capacitor MC constituted by the capacitor electrode patterns P1 and P2, which is in the vicinity of the coupling coil CC1, is disposed offset to the one short side of the substrate 30. On the other hand, the resonance capacitor RC constituted by the capacitor electrode patterns P3 and P4 is disposed offset in the positive x-direction, i.e., to the other short side. When the resonance capacitor RC is thus disposed away from the coupling coil CC1 or matching capacitor MC, mutual interference therebetween can be prevented.

As illustrated in FIG. 3, the magnetic sheet 20 is disposed between the metal plate 10 and the substrate 30. The material of the magnetic sheet 20 is not particularly limited as long as it has high permeability and may be a bulk body of ferrite or a metal magnetic material, or may be a composite magnetic material obtained by mixing a resin material and ferrite powder or metal magnetic powder. The planar size of the magnetic sheet 20 is slightly larger than those of the outer shapes of the antenna coil AC and booster coil BC and thereby functions as a magnetic path for magnetic flux interlinking with the antenna coil AC and booster coil BC. The IC card 1 according to the present embodiment has the metal plate 10 made of a metal material, so that when the metal plate 10 and substrate 30 are made to directly overlap each other, communication becomes difficult; however, when the magnetic sheet 20 is interposed between the metal plate 10 and the substrate 30, communication becomes possible.

The magnetic sheet 20 has an opening 21 at a position overlapping the coupling coil CC1. Thus, the coupling coil CC1 and IC module 50 directly face each other without the magnetic sheet 20.

Figure 7:
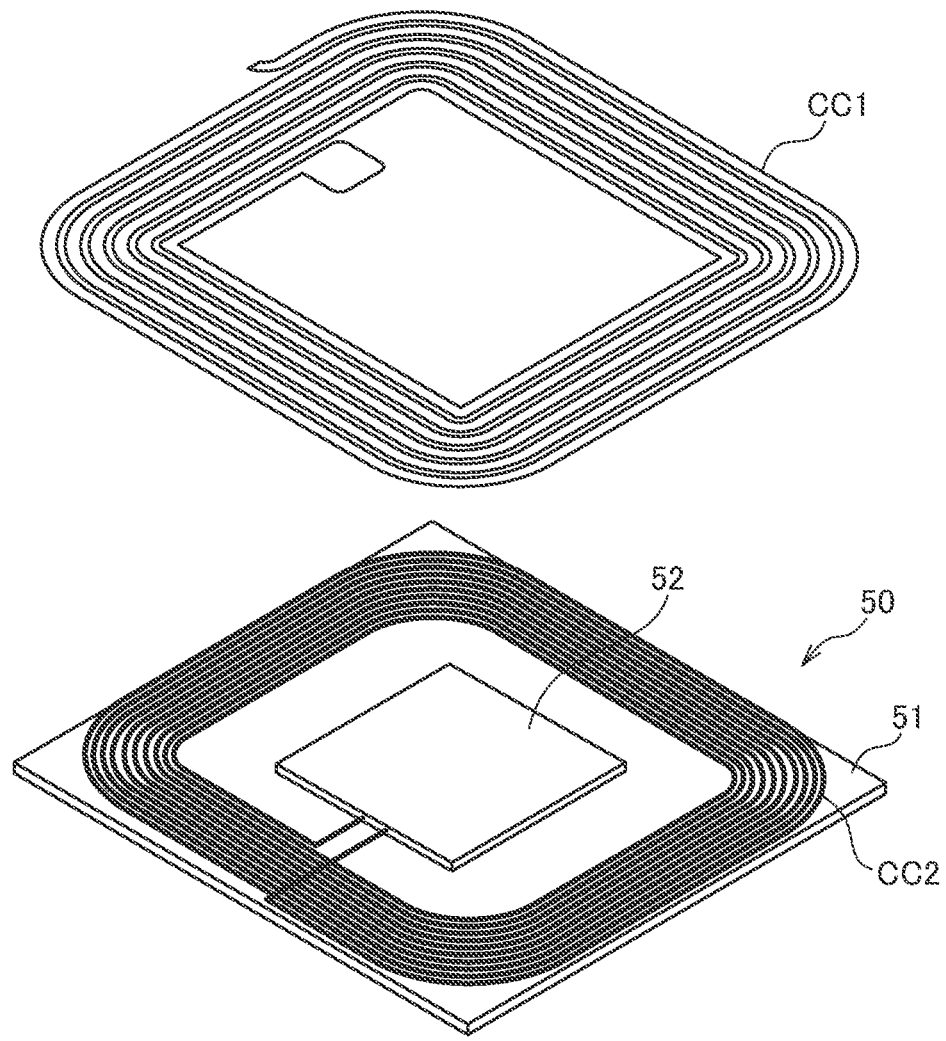
FIG. 7 is a schematic perspective view of the IC module as viewed from the back surface side.

FIG. 7 is a schematic perspective view of the IC module 50 as viewed from the back surface side.

As illustrated in FIG. 7, the IC module 50 includes a module substrate 51 and an IC chip 52 mounted on or incorporated in the module substrate 51, and a coupling coil CC2 is formed on the back surface of the module substrate 51. The terminal electrode E illustrated in FIG. 1 is provided on the front surface (upper surface) side of module substrate 51. The inner diameter size and outer diameter size of the coupling coil CC2 are substantially the same as those of the coupling coil CC1 provided on the substrate 30, so that when the coupling coils CC1 and CC2 are made to overlap each other, electromagnetic coupling is generated. As a result, it is possible to connect the IC module 50 and the antenna coil AC in an alternating current manner through the coupling coils CC1 and CC2 without directly connecting them using a terminal electrode.

FIGS. 8A to 8C are views illustrating a preferred relationship between the coupling coils CC1, CC2 and openings 11 and 21. FIG. 8A is a plan view, FIG. 8B is a cross-sectional view, and FIG. 8C is a cross sectional view according to a modification.

In FIG. 8A, reference numeral 81 denotes the coil area of the coupling coil (CC1, CC2), i.e., an area corresponding to the conductor pattern that is positioned between the outermost turn and the innermost turn, of the coupling coil, and reference numeral 82 denotes the inner diameter area of the coupling coil (CC1, CC2), i.e., an area surrounded by the innermost turn of the coupling coil. As illustrated in FIG. 8A, the inner diameter area 82 and coil area 81 completely overlap the opening 21. As a result, the magnetic sheet 20 is completely absent between the inner diameter area 82 and coil area 81 of the coupling coil CC1 and the inner diameter area 82 and coil area 81 of the coupling coil CC2, thus preventing the electromagnetic coupling between the coupling coil CC1 and the coupling coil CC2 from being blocked by the magnetic sheet 20.

However, in the present invention, it is not essential that the coil area 81 completely overlaps the opening 21, but the magnetic sheet 20 may partially overlap the coil area 81. Even in this case, the inner diameter area 82 preferably completely overlaps the opening 21 in order to ensure sufficient coupling between the coupling coils CC1 and CC2. Further, as illustrated in FIG. 8A, the opening 11 of the metal plate 10 is larger in size than the opening 21 of the magnetic sheet 20; however, this is not essential, and the opening 21 of the magnetic sheet 20 may be larger in size than the opening 11 of the metal plate 10, or the openings 21 and 22 may be equal in size.

Further, in the present embodiment, as illustrated in FIG. 8B, the coupling coil CC1 is formed on the one surface 31 of the substrate 30, i.e., the surface of the substrate 30 that is opposite to the other surface 32 facing the magnetic sheet 20; however, as in the modification illustrated in FIG. 8C, the coupling coil CC1 may be formed on the other surface 32 of the substrate 30, i.e., the surface of the substrate 30 that faces the magnetic sheet 20. In the former case, even when a composite magnetic material that has been applied onto the other surface 32 of the substrate 30 is partially removed to form the opening 21, the coupling coil CC1 is not damaged during the partial removal of the composite magnetic material. In this case, the connection pattern 72 illustrated in FIG. 5 is subject to the removal process of the composite magnetic material, and when the damage to the connection pattern 72 may become significant, the conductor width of the connection pattern 72 is designed to be larger than those of the other patterns such as the coupling coil CC1. In the latter case, the distance between the coupling coils CC1 and CC2 is reduced, thereby further enhancing the coupling strength therebetween.

Figure 9:
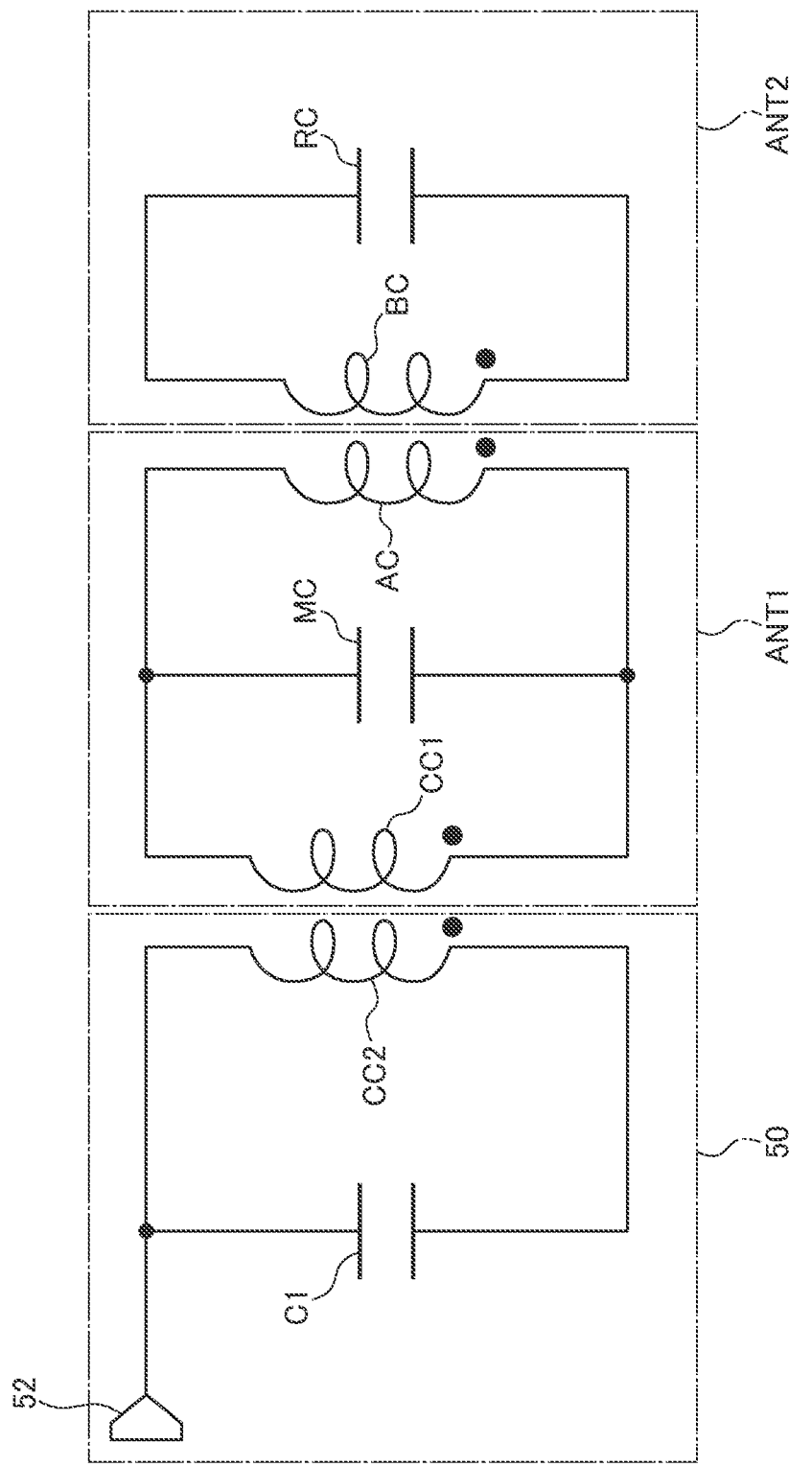
FIG. 9 is an equivalent circuit diagram of the IC card according to a preferred embodiment of the present invention.

FIG. 9 is an equivalent circuit diagram of the IC card 1 according to the present embodiment.

As illustrated in FIG. 9, in the present embodiment, one end of the antenna coil AC and one end of the coupling coil CC1 are connected to each other, the other end of the antenna coil AC and the other end of the coupling coil CC1 are connected to each other, and the matching capacitor MC is connected to these connection points, thereby constituting a main antenna ANT1. The coupling coil CC1 included in the main antenna ANT1 is electromagnetically coupled to the coupling coil CC2 included in the IC module 50. The coupling coil CC2 is connected in parallel to an input capacitor C1, and one end of the input capacitor C1 is connected to the input terminal of the IC chip 52.

The antenna coil AC included in the main antenna ANT1 not only performs communication with the card reader 4 illustrated in FIG. 1 but also is electromagnetically coupled to the booster coil BC. The booster coil BC and resonance capacitor RC constitute an auxiliary antenna ANT2. The IC card 1 according to the present embodiment performs communication with the card reader 4 using the main antenna ANT1 and auxiliary antenna ANT2 and can thus extend its communication distance.

For extending the communication distance, a method of not using the booster coil BC but increasing the number of turns of the antenna coil AC is considered to be effective; however, the increase in the number of turns of the antenna coil AC brings about an increase in the resistance component of the antenna coil AC, resulting in a large loss. In particular, in the present embodiment, the antenna coil AC and coupling coil CC1 are connected in series and, accordingly, the resistance components of the two coils are added together, thus making it difficult to increase the number of turns of the antenna coil AC while suppressing a loss due to such a resistance component.

On the other hand, in the present embodiment, not the number of turns of the antenna coil AC is increased, but the booster coil BC electromagnetically coupled to the antenna coil AC is used, so that it is possible to extend the communication distance without increasing the resistance component. In addition, in the present embodiment, the number of turns of the booster coil BC is larger than the number of turns of the antenna coil AC, so that it is possible to further reduce the resistance component of the antenna coil AC and to enhance the characteristics of the auxiliary antenna ANT2 using the booster coil BC.

As described above, the IC card 1 according to the present embodiment has the magnetic sheet 20 between the substrate 30 and the metal plate 10 constituting the antenna device and can thus perform wireless communication with the card reader 4 with the back surface b side facing the card reader 4 without being blocked by the metal plate 10. Further, the magnetic sheet 20 has the opening 21 at a position overlapping the coupling coils CC1 and CC2, so that the electromagnetic coupling between the coupling coils CC1 and CC2 is not blocked by the magnetic sheet 20. Further, the IC card 1 according to the present embodiment has the booster coil BC electromagnetically coupled to the antenna coil AC, so that it is possible to ensure a sufficient communication distance while suppressing the resistance component of the antenna coil AC.

It is apparent that the present invention is not limited to the above embodiments, but may be modified and changed without departing from the scope and spirit of the invention.

For example, although the matching capacitor MC or resonance capacitor RC is formed by the capacitor electrode patterns formed respectively on both surfaces of the substrate 30 in the above embodiment, one or both of the capacitor electrode patterns may be a chip-type capacitor component.

What is claimed is:

1. An antenna device comprising:
    a substrate;
    a conductor pattern formed on the substrate and including a spiral or loop-shaped antenna coil, a spiral or loop-shaped coupling coil being connected to the antenna coil and having a diameter smaller than that of the antenna coil, and a spiral-shaped booster coil at least partially overlapping the antenna coil through the substrate without being connected thereto; and
    a resonance capacitor connected to the booster coil,
    wherein a number of turns of the booster coil is larger than that of the antenna coil.

2. The antenna device as claimed in claim 1,
    wherein the substrate has a rectangular shape,
    wherein the antenna coil is formed on one surface of the substrate along sides thereof, and
    wherein the booster coil is formed on other surface of the substrate along sides thereof.

3. The antenna device as claimed in claim 2, wherein the coupling coil is provided at a position overlapping inner diameter areas of the antenna coil and booster coil and disposed offset to one short side of the substrate.

4. The antenna device as claimed in claim 3, wherein the resonance capacitor is constituted by the conductor pattern and disposed offset to other short side of the substrate.

5. The antenna device as claimed in claim 3,
    wherein the conductor pattern further includes a matching capacitor connected in series or parallel to the antenna coil, and
    wherein the matching capacitor is provided at a position overlapping the inner diameter areas of the antenna coil and booster coil and disposed offset to the one short side of the substrate.

6. An IC card comprising:
    an antenna device comprising:
        a substrate;
        a conductor pattern formed on the substrate and including a spiral or loop-shaped antenna coil, a spiral or loop-shaped coupling coil being connected to the antenna coil and having a diameter smaller than that of the antenna coil, and a spiral-shaped booster coil at least partially overlapping the antenna coil through the substrate without being connected thereto, wherein a number of turns of the booster coil is larger than that of the antenna coil; and
        a resonance capacitor connected to the booster coil;
    a metal plate provided overlapping the antenna device;
    a magnetic sheet disposed between the antenna device and the metal plate; and
    an IC module electromagnetically coupled to a coupling coil.

7. The IC card as claimed in claim 6,
    wherein the metal plate has a first opening,
    wherein the IC module is disposed within the first opening,
    wherein the magnetic sheet has a second opening at a portion overlapping the IC module, and
    wherein the coupling coil and IC module are electromagnetically coupled to each other through the second opening.

8. The IC card as claimed in claim 7, wherein an inner diameter area of the coupling coil completely overlaps the second opening in a plan view.

9. The IC card as claimed in claim 8, wherein a coil area of the coupling coil completely overlaps the second opening in a plan view.

10. The IC card as claimed in claim 7, wherein the coupling coil is formed on a surface of the substrate that is opposite to a surface facing the magnetic sheet.

11. An apparatus comprising:
a substrate having first and second surfaces opposite to each other;
a first coil pattern formed on the first surface of the substrate;
a second coil pattern formed on the first surface of the substrate such that the second coil pattern is surrounded by the first coil pattern;
a third coil pattern formed on the second surface of the substrate such that the third coil pattern overlaps the first coil pattern; and
a first connection pattern formed on the first surface of the substrate and connected between an inner peripheral end of the first coil pattern and an outer peripheral end of the second coil pattern,
wherein the third coil pattern is isolated from the first and second coil patterns.

12. The apparatus as claimed in claim 11, further comprising:
a first through hole conductor penetrating the substrate and connected to an outer peripheral end of the first coil pattern;
a second through hole conductor penetrating the substrate and connected to an inner peripheral end of the second coil pattern; and
a second connection pattern formed on the second surface of the substrate and connected between the first and second through hole conductors.

13. The apparatus as claimed in claim 12, further comprising:
a first capacitor electrode pattern formed on the first surface of the substrate and connected to the first connection pattern; and
a second capacitor electrode pattern formed on the second surface of the substrate and connected to the second connection pattern,
wherein the second capacitor electrode pattern overlaps the first capacitor electrode pattern.

14. The apparatus as claimed in claim 13, further comprising:
a third capacitor electrode pattern formed on the first surface of the substrate; and
a fourth capacitor electrode pattern formed on the second surface of the substrate such that the fourth capacitor electrode pattern overlaps the third capacitor electrode pattern,
wherein the third and fourth capacitor electrode patterns are connected to the third coil pattern.

15. The apparatus as claimed in claim 14,
wherein the third capacitor electrode pattern is connected to an inner peripheral end of the third coil pattern, and
wherein the fourth capacitor electrode pattern is connected to an outer peripheral end of the third coil pattern.

16. The apparatus as claimed in claim 11, further comprising:
a metal plate having a first opening;
a magnetic sheet disposed between the substrate and the metal plate, the magnetic sheet having a second opening overlapping the first opening; and
an IC module having a fourth coil pattern,
wherein the IC module is disposed within the first opening such that the second coil pattern and the fourth coil pattern are electromagnetically coupled to each other through the second opening.

* * * * *